United States Patent [19]
Uchio et al.

[11] Patent Number: 5,841,154
[45] Date of Patent: Nov. 24, 1998

[54] LIGHT-EMITTING DIODE DEVICE WITH REDUCED SCATTER

[75] Inventors: Masatoshi Uchio; Kazuyoshi Yamagata; Yuichi Umeda, all of Fukushima-ken; Junichi Saito, Miyagi-ken, all of Japan

[73] Assignee: Alps Electric Co., Ltd., Japan

[21] Appl. No.: 731,376

[22] Filed: Oct. 10, 1996

[30] Foreign Application Priority Data

Oct. 17, 1995 [JP] Japan ..................... 7-268741

[51] Int. Cl.$^6$ ............................................. H01L 33/00
[52] U.S. Cl. ................................ 257/99; 257/88; 257/98
[58] Field of Search ............................. 257/88, 98–100

[56] References Cited

U.S. PATENT DOCUMENTS 3,715,636  2/1973  Jaffe et al. ............................ 257/98
3,760,237  9/1973  Jaffe .................................... 257/98
4,316,208  2/1982  Kobayashi et al. .................. 257/99
5,266,817 11/1993  Lin ...................................... 257/99

FOREIGN PATENT DOCUMENTS 5-175906  7/1993  Japan .

*Primary Examiner*—Gene M. Munson
*Attorney, Agent, or Firm*—Brinks Hofer Gilson & Lione

[57] ABSTRACT

A light-emitting diode device includes a light-emitting diode, a lens cap made of synthetic resin, for covering the light-emitting surface of the light-emitting diode means, and a refractive layer formed between the light-emitting surface and the lens cap, the refractive layer having a composition, such as an air layer, with a refractive index different from the refractive index of said synthetic resin. In this arrangement the relationship between the light intensity and directional angles is shown by characteristics in which the light intensity is maximum in the center of the directional angles, and is relatively flat in the form of a sinusoid in the wide range of the directional angles. Therefore, even when the characteristics of each light-emitting diode is not verified, a predetermined light-signal transmission range is readily obtained without being affected by a scatter in the characteristics.

4 Claims, 5 Drawing Sheets

LIGHT-EMITTING DIODE DEVICE WITH REDUCED SCATTER

BACKGROUND OF THE INVENTION

1. Field of the Invention

The present invention generally relates to light-emitting diode devices, and in particular to a light-emitting diode device in which the light-emitting surface of a light-emitting diode is provided with a lens cap and a light-refractive layer which eliminate affection by scatter in light-emission characteristics of the light-emitting diode.

2. Description of the Related Art

Conventionally, when light-information, for example, infrared information, is transmitted in a relatively short distance, and when a light signal, for example, an infrared signal, for controlling various types of control equipment, is transmitted, a light-emitting diode device that has one light-emitting diode or a plurality of light-emitting diodes is used.

Such a light-emitting diode device has the range of angles at which the device is capable of transmitting the light signal that has operational intensity (which range is referred to as the "light-signal transmission range" hereinafter). The light-signal transmission range is determined based on the intensity and the radiation directional characteristics of light emitted by one light-emitting diode or a plurality of light-emitting diodes used in the light-emitting diode device. In order to relatively broaden the light-signal transmission range of the light-emitting diode device, the device uses a plurality of light-emitting diodes that are disposed, in which device the angles at which the optical axes of the respective light-emitting diodes are positioned are slightly different.

On the other hand, light-emitting diodes on the market have scatter in various types of characteristics, caused by any manufacturing process. Such characteristics include so-called "scatter in the optical-axis shift", which means a shift in the optical-axis position of a light-emitting diode with respect to the position at which the radiation intensity is maximum. The characteristics also include so-called "scatter in the maximum light intensity", which means that the maximum radiated-light intensity does not become a constant value. The characteristics further include so-called "scatter in the half-value angles", which means that the range of directional angles at which the radiated-light intensity exceeds ½ of the maximum radiated-light intensity does not become constant.

FIG. 6 is a characteristic graph showing the relationship between the light intensity and the directional angles in one light-emitting diode. A solid line represents the characteristics of an ideal light-emitting diode. A dotted line a represents the characteristics of a light-emitting diode in which its optical axis is shifted. A dotted line b represents the characteristics of a light-emitting diode in which the maximum light intensity decreases lower than the normal intensity value. A dotted line c represents the characteristics of a light-emitting diode in which the half-value angles are smaller than the normal half-value angles.

When a light-emitting diode is ideal, the maximum position of the radiated-light intensity agrees with the optical-axis position of the light-emitting diode, the maximum radiated-light intensity is a normal intensity value, and the half-value angle is a normal half-value angle, as represented by the solid line shown in FIG. 5.

However, the light-emitting diodes on the market include a type in which the maximum position of the radiated-light intensity does not agree with the optical-axis position of a light-emitting diode, which type has a so-called "optical-axis shift", as represented by the dotted line a shown in FIG. 6, a type in which the maximum radiated-light intensity slightly decreases lower than the normal intensity value, as represented by the dotted line b shown in FIG. 6, and a type in which the half-value angle is slightly smaller than the normal half-value angle, as represented by the dotted line c shown in FIG. 6. According to the circumstances, the light-emitting diodes on the market include a type in which the optical axis is shifted, and the maximum value of the radiated-light intensity decreases lower than the normal maximum value, and a type in which the optical axis is shifted, and the half-value angle is smaller than the normal half-value angle. Accordingly, when a light-emitting diode device is formed by a light-emitting diode that has such scatter in the characteristics, the light-signal transmission range, which is desired, may not be obtained.

FIG. 7 is a characteristic graph showing the relationship between the whole light intensity and the directional angles obtained when a plurality of light-emitting diodes, in this case, three light-emitting diodes are used. Thin solid lines represent the respective characteristics obtained by three ideal light-emitting diodes. A bold solid line represents the characteristics obtained by a combination of the three ideal light-emitting diodes. Dotted lines a and b represent examples of the characteristics obtained by three light-emitting diodes which have scatter in their characteristics.

As shown in FIG. 7, when the three ideal light-emitting diodes are disposed at equal directional-angle intervals, the relationship between light intensity and directional angles obtained by the respective light-emitting diodes is described, as represented by the thin solid lines, such that the optical axes agree with the directional-angle intervals, respectively, and the maximum values of the light intensity mutually agree, approximately. The relationship between the overall light intensity and directional angles obtained by a combination of these three light-emitting diodes is described, as represented by the bold solid line, such that in a predetermined directional-angle range the maximum value of light intensity is almost flat.

To the contrary, similarly as shown in FIG. 7, when three light-emitting diodes having scatter in characteristics are disposed at equal directional-angle intervals, the relationship between light intensity and directional angles obtained by the respective light-emitting diodes is not as represented by the thin solid lines, which relationship is not shown in FIG. 7. The relationship between the overall light intensity and the directional angles obtained by a combination of these three light-emitting diodes is expressed as a so-called "waveform characteristics", in which in a predetermined directional-angle range the maximum value of the light intensity waves, as represented by the dotted lines a and b.

A known light-emitting diode device which includes one light-emitting diode having characteristics as shown by the dotted line a, b or c in FIG. 6 has a problem in which when a light signal sent from the device is detected by a receiver, the linearity and detection sensitivity of the received signal are affected. The known device also has a problem in which the light-signal transmission range in the device is narrowed, and so forth.

To solve these problems, by verifying, in advance, the characteristics of each light-emitting diode used in the light-emitting diode device, the selected light-emitting diode that has desired characteristics can be used. Such verification of the characteristics of each light-emitting diode requires considerable labor and time.

Also, a known light-emitting diode device that includes a plurality of light-emitting diodes, for example, three light-emitting diodes having scatter in characteristics shows characteristics in which the maximum value of light intensity is expressed as a waveform in a predetermined directional-angle range, serving as the overall characteristics of a combination of these three light-emitting diodes, as represented by the dotted line a or b in FIG. 7. In addition, when such waveform characteristics occur, in a condition in which light intensity in the vicinity of the bottom portion of the waveform extremely decreases compared with its maximum value, the known device has a problem in which a dead zone of the light-signal transmission range occurs in the vicinity of the bottom portion of the waveform.

To solve this problem in such a case, by verifying, in advance, the characteristics of the respective light-emitting diodes used in the light-emitting diode device, the selected light-emitting diodes whose characteristics mutually match can be used. Similar to the former case, the verification of the characteristics of the respective light-emitting diodes and the selection of the diodes whose characteristics mutually match require considerable labor and time.

SUMMARY OF THE INVENTION

Accordingly, to solve all of the above problems, it is an object of the present invention to provide a light-emitting diode device in which the characteristics of each light-emitting diode does not need to be verified, and in which affection by scatter in the characteristics of the light-emitting diode is reduced.

In accordance with an aspect of the present invention, the foregoing object is achieved through the provision of a light-emitting diode device comprising: light-emitting diode means; lens cap means made of synthetic resin, for covering the light-emitting surface of the light-emitting diode means; and refractive layer means formed between the light-emitting surface means and the lens cap means, the refractive layer means having a composition with a refractive index different from the refractive index of the synthetic resin.

The refractive layer means may be formed by an air layer, and the thickness of the air layer is least on the head of the light-emitting surface and is larger as the layer is closer to the peripheral portion of the light-emitting surface.

A light-diffusion filter may be disposed on the front of the lens cap means.

The light-diffusion filter may comprise a surface of the lens cap means on which surface fine irregularities are formed at random.

The light-emitting diode device may comprise: the light-emitting diode means formed by a plurality of light-emitting diodes arranged so that the angles of the respective optical axes thereof are different; the lens cap means formed by a plurality of lens caps disposed on a common cap support with respect to the plurality of light-emitting diodes; and the refractive layer means formed by a plurality of refractive layers formed between the lens caps disposed on the common cap support and the light-emitting surfaces of the plurality of light-emitting diodes corresponding to the respective lens caps.

In accordance with the above-described light-emitting device, the surface of the light-emitting diode means is covered with the lens cap means made of synthetic resin, with the refractive layer means formed therebetween, the refractive layer means having a composition with a refractive index different from the refractive index of the lens cap means. Therefore, light outputted from the vicinity of the head of the light-emitting surface is slightly attenuated by the refractive layer means and lens cap means to be almost rectilinearly emitted to the outside, while light outputted from the peripheral portion apart from the head of the light-emitting surface is refracted by the refractive layer means so as to be directed to the head, and subsequently is emitted to the outside through the lens cap means with the direction of the light unchanged. Accordingly, the relationship between the light intensity and directional angles of one light-emitting diode is shown by characteristics in which the light intensity is approximately maximum in the center of the directional angles, and gets attenuated relatively flat in proportion to the distance from the center, in other words, the relationship is shown by characteristics whose form approximates an approximate sinusoid.

In a light-emitting diode device including one light-emitting diode, light intensity in the vicinity of the optical axis of the diode is not extremely large and is not extremely small, and in addition, the half-value angle of the light intensity is sufficiently maintained. Thus, even when the characteristics of each light-emitting diode is not verified, the light-emitting diode device is capable of obtaining a predetermined light-signal transmission range, without being affected by scatter in the characteristics. Further, in a light-emitting diode device including two or more light-emitting diodes, light intensity in the vicinity of the optical axis of each diode is not extremely large and is not extremely small, and in addition, the half-value angle of the light intensity is sufficiently maintained. Thus, even when the characteristics of each light-emitting diode is not verified, the light-emitting diode device is capable of overall obtaining a predetermined light-signal transmission range, without being affected by scatter in the characteristics.

DESCRIPTION OF THE PREFERRED EMBODIMENTS

By referring to the attached drawings, embodiments of the present invention will be described below.

Figure 1:
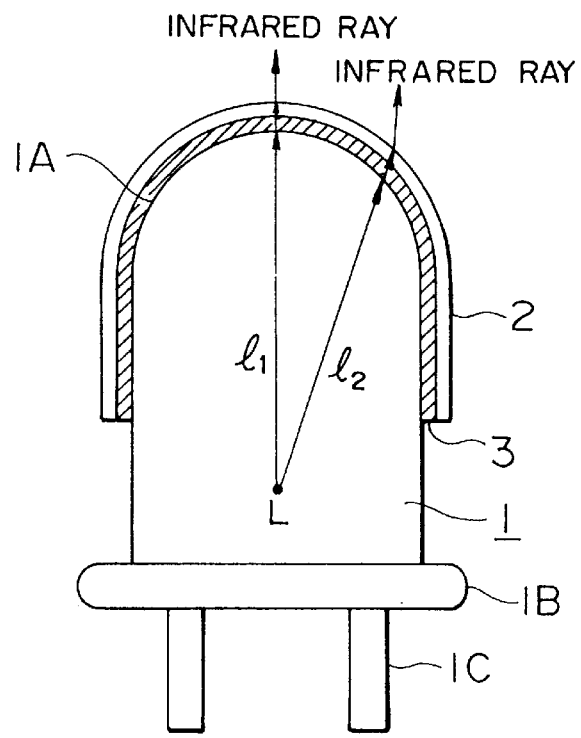
FIG. 1 is a sectional view illustrating a light-emitting diode device according to a first embodiment of the present invention.

FIG. 1 illustrates a light-emitting diode device, having one light-emitting diode, according to a first embodiment of the present invention.

A light-emitting diode 1 that emits light having an infrared wavelength region (infrared light) includes a light-emitting surface 1A, a rim 1B, and leads 1C. The light-emitting surface 1A is provided with a lens cap 2 made of synthetic resin so that the whole surface 1A is covered with the cap 2. Between the exterior of the light-emitting surface 1A and the interior of the lens cap 2, a medium whose refractive index is different from the refractive index of the synthetic resin, for example, a refractive layer 3 formed by an air layer is formed. In the first embodiment the refractive layer 3 is formed so as to have a constant thickness over the whole light-emitting surface 1A.

The light-emitting diode device according to the first embodiment operates as follows:

When electric power is supplied to the light-emitting diode 1, a light source L in the light-emitting diode 1 emits infrared rays onto the light-emitting surface 1A. An infrared ray $l_1$ emitted onto the proximity of the head of the light-emitting surface 1A is slightly attenuated by the refractive layer 3, and passes through the refractive layer 3, almost without being refracted. The infrared ray $l_1$ is then slightly attenuated by the lens cap 2, and passes through the lens cap 2, almost without being refracted, so that it is projected outside almost rectilinearly. To the contrary, an infrared ray $l_2$ emitted in the peripheral direction apart from the head of the light-emitting surface 1A passes through the refractive layer 3, while being slightly attenuated by the refractive layer 3 and being refracted so as to be directed to the head direction. The infrared ray $l_2$ passes through the lens cap 2, while being slightly refracted by the lens cap 2 and being directed to the head direction, and is projected outside with the direction maintained.

Figure 5:
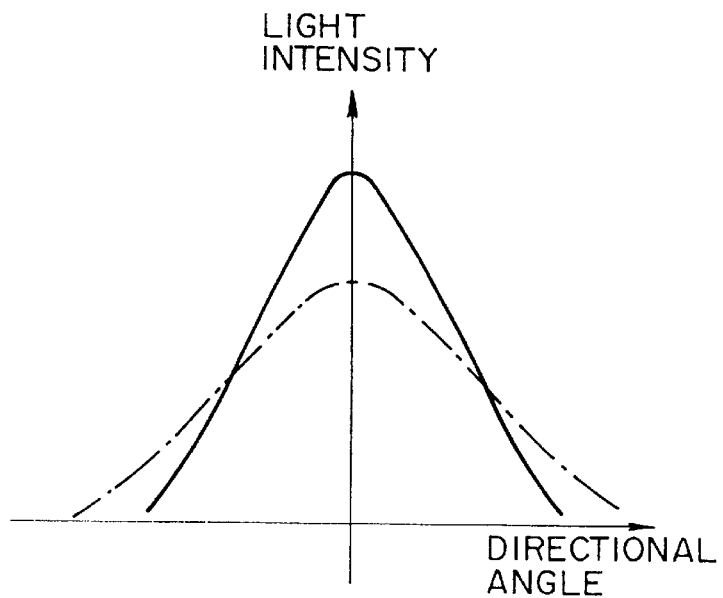
FIG. 5 is a graph showing that the relationship between light intensity and directional angles in the light-emitting diode devices shown in FIGS. 1 and 2 is compared with the same relationship in a known light-emitting diode device.
Figure 6:
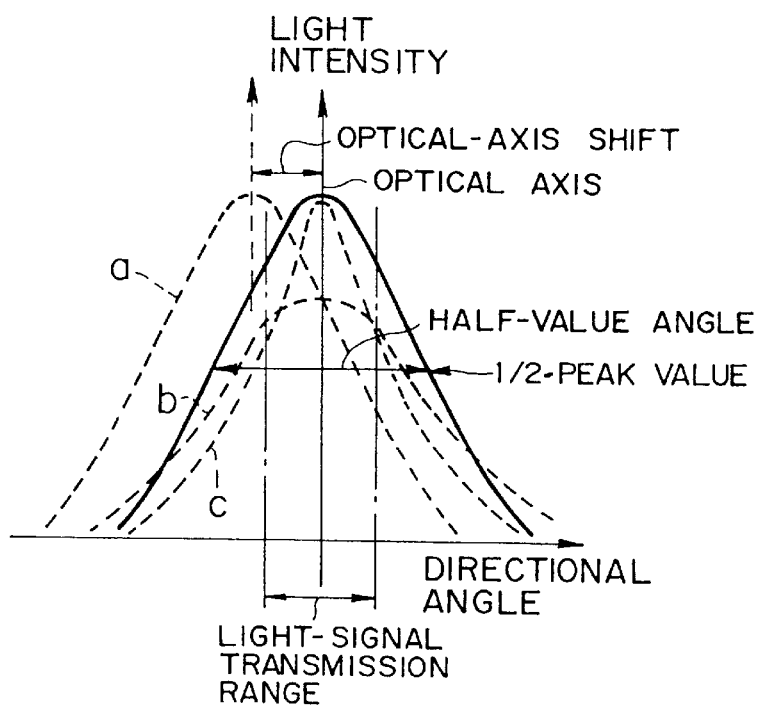
FIG. 6 is a graph showing that in a known light-emitting diode device having one light-emitting diode the relationship between light intensity and directional angles observed when light-emitting diode characteristics are scattered is compared with the relationship between light intensity and directional angles observed when light-emitting diode characteristics are not scattered.

FIG. 5 shows the relationship between light intensity and directional angles in the light-emitting diode devices having a structure shown in FIG. 1 (referred to as "the device according to the first embodiment" hereinafter) and the same relationship in a known light-emitting diode device (referred to as "the known device" hereinafter) which is not provided with the lens cap 2 and the refractive layer 3. The characteristics of the device according to the first embodiment is represented by a dotted line, while the characteristics of the known device is represented by a solid line.

As shown in FIG. 5, compared with the characteristics of the known device, the characteristics of the device according to the first embodiment shows that maximum light intensity in the center of the directional angles slightly decreases, while light intensity in peripheral portions apart from the center of the directional angles increases. Accordingly, the characteristics of the device according to the first embodiment is expressed by a rough sinusoid which shows a relatively flat change, against the characteristics of the known device, expressed by a rough sinusoid showing a rapid change. Therefore, in accordance with the device according to the first embodiment, compared with the known device, even when the characteristics of each light-emitting diode 1 is not verified, affection by scatter in the characteristics of the light-emitting diode 1, for example, scatter in an optical-axis shift, scatter in maximum light intensity from normal light intensity, and scatter in half-value angles from normal half-value angles are reduced, and thereby a predetermined light-signal transmission range is readily obtained.

Figure 2:
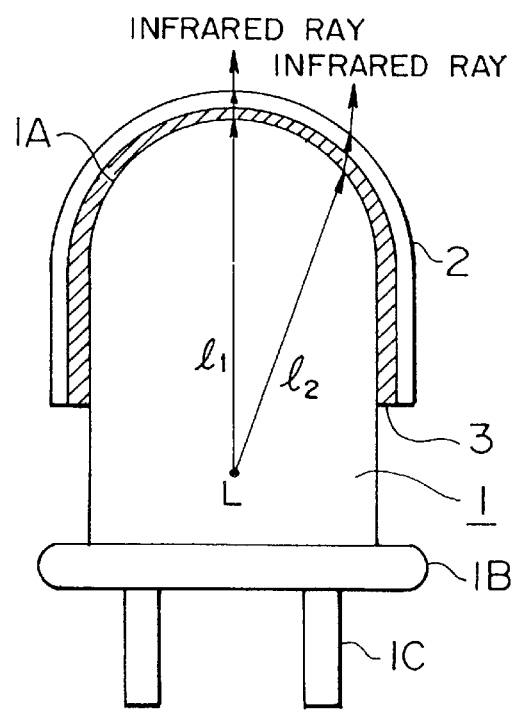
FIG. 2 is a sectional view illustrating a light-emitting diode device according to a second embodiment of the present invention.

FIG. 2 shows a light-emitting diode device according to a second embodiment of the present invention, which device also has one light-emitting diode.

Components shown in FIG. 2 that are the same as those shown in FIG. 1 are denoted by the same reference numerals.

The device according to the second embodiment differs from the device according to the first embodiment in which the thickness of the refractive layer 3 is constant over the whole light-emitting surface 1A, only in that the thickness of a refractive layer 3 in the head of a light-emitting surface 1A, which agrees with an optical axis in a light-emitting diode 1, is least, and the thickness gradually increases from the head to the peripheral surface portion of the light-emitting surface 1A. Except for this point, there is no structural difference between the devices according to the second embodiment and the first embodiment. Accordingly, the further description of the device according to the second embodiment will be omitted.

The operation of the device according to the second embodiment differs from the operation of the device according to the first embodiment, only in that, when an infrared ray $l_2$ emitted in the peripheral direction apart from the head of the light-emitting surface 1A is refracted while being slightly attenuated by the refractive layer 3 so as to be directed to the head direction, the direction of the refraction is the same, however the extent of the refraction is slightly different. Except for this point, the operation of the device according to the second embodiment is the same as that of the device according to the first embodiment. Accordingly, the further description of the operation will also be omitted.

Figure 3:
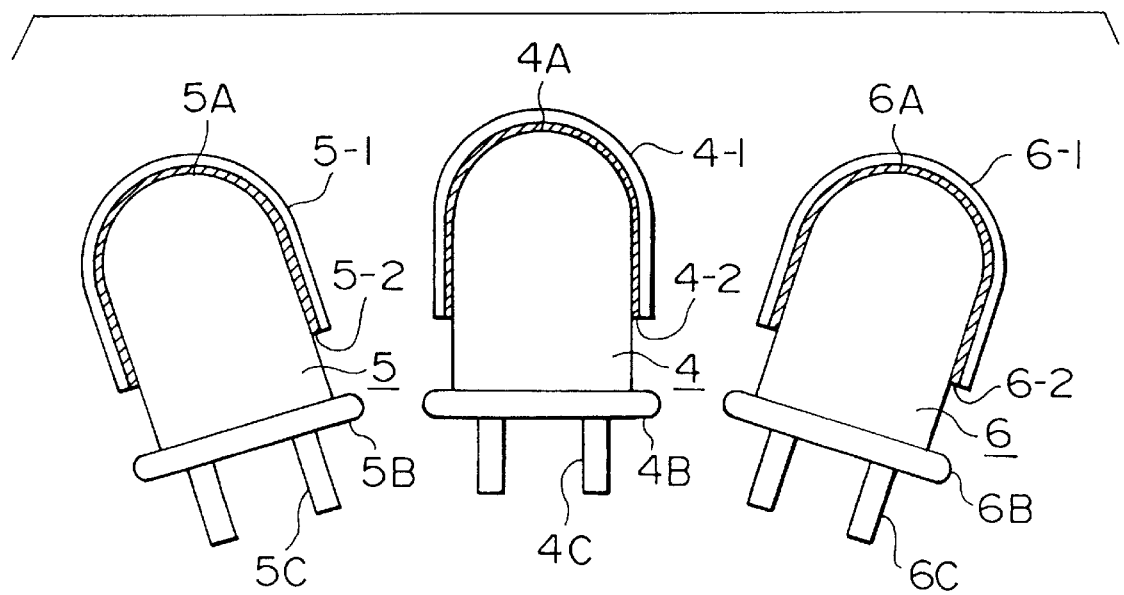
FIG. 3 is a sectional view illustrating a light-emitting diode device according to a third embodiment of the present invention.

FIG. 3 shows a light-emitting diode device according to a third embodiment of the present invention, which device has three light-emitting diodes.

Light-emitting diodes 4, 5 and 6 which emit infrared light each have the same structure as that of the light-emitting diode 1 shown in FIG. 1, which are respectively provided with light-emitting surfaces 4A, 5A and 6A, rims 4B, 5B and 6B, and leads 4C, 5C and 6C. The light-emitting diodes 4, 5 and 6 are provided with lens caps made of synthetic resin, 4-1, 5-1 and 6-1 so that the caps cover the diodes. Media whose refractive indices are different from the refractive index of the synthetic resin, for example, refractive layers 4-2, 5-2 and 6-2 formed by air layers are formed between the exteriors of the light-emitting surfaces 4A, 5A and 6A and the interiors of the lens caps 4-1, 5-1 and 6-1 corresponding to the exteriors. The respective refractive layers 4-2, 5-2 and 6-2 are formed so that the thicknesses of them are constant over the whole light-emitting surfaces 4A, 5A and 6A.

The light-emitting diode device according to the third embodiment operates as follows:

When the light-emitting diodes 4, 5 and 6 are supplied with electric power, the respective light sources (not shown) emit infrared light. In one light-emitting diode, for example, the light-emitting diode 4, an infrared ray (not shown) emitted onto the proximity of the head of the light-emitting surface 4A passes through the refractive layer 4-2 while being slightly attenuated and not being refracted. This infrared ray passes through the lens cap 4-1 while being slightly attenuated, so that it is projected outside almost rectilinearly. To the contrary, an infrared ray (not shown) emitted onto the peripheral direction apart from the head of the light-emitting surface 4A passes through the refractive layer 4-2 while being slightly attenuated and refracted so as to being directed to the head direction. This infrared ray passes through the lens cap 4-1 while being slightly attenuated so as to be directed to the head direction, and is projected outside with the direction maintained. Paths in which infrared rays emitted from the other light-emitting diodes 5 and 6 are transmitted are quite the same as the path in which the infrared light emitted from the light-emitting diode 4 is transmitted.

In such a case, when the relationship (represented by the dotted line in FIG. 5) between light intensity and directional angles in the respective light-emitting diodes 4, 5 and 6 is compared with the relationship in the known light-emitting diode which does not have the refractive layers 4-2, 5-2 and 6-2, and lens caps 4-1, 5-1 and 6-1, it is found that maximum light intensity slightly decrease, while light intensity in peripheral portions apart from the center of the directional angles increases. Accordingly, the characteristics of the device according to the third embodiment is expressed by a rough sinusoid which shows a relatively flat change, against the characteristics of the known device, expressed by a rough sinusoid showing a rapid change. Therefore, even when the characteristic of the respective light-emitting diodes 4, 5 and 6 are not verified, affection by scatter in the characteristics is reduced.

Figure 7:
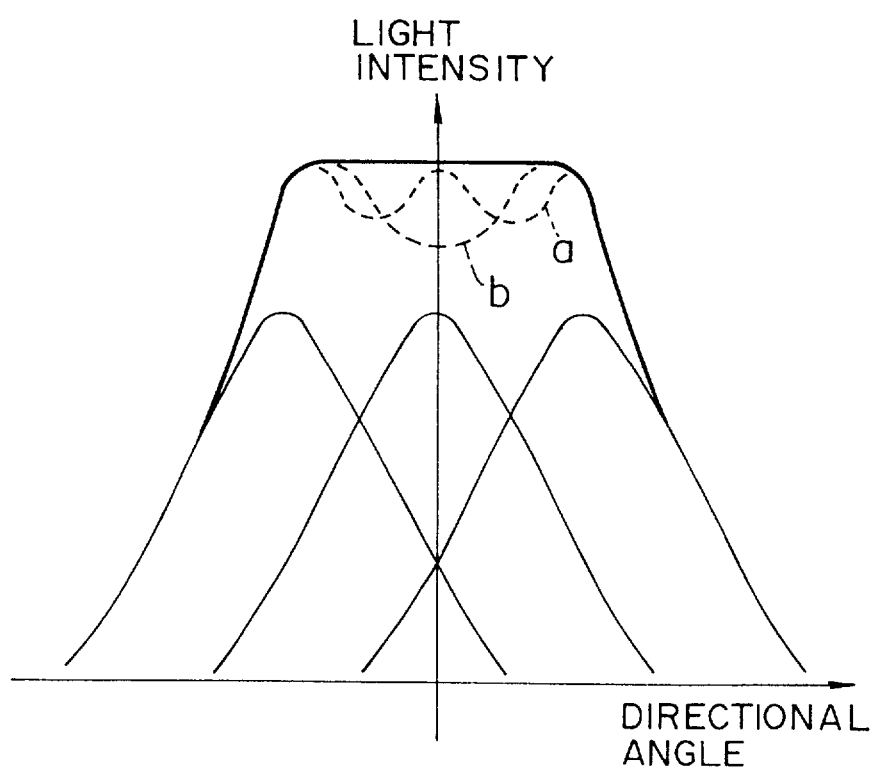
FIG. 7 is a graph showing that in a known light-emitting diode device having three light-emitting devices the relationship between light intensity and directional angles observed when light-emitting diode characteristics are scattered is compared with the relationship between light intensity and directional angles observed when light-emitting diode characteristics are not scattered.

In accordance with the device according to the third embodiment, as shown by the relationship between the overall light intensity and directional angles obtained by the arrangement of the three light-emitting diodes 5, 6 and 7, which is represented by a bold solid line in FIG. 7, maximum light intensity is expressed as roughly flat in a predetermined range, as well as a dead zone in the waveform characteristics, represented by dotted lines a and b, of the known light-emitting diode device having three light-emitting diodes is eliminated, and therefore it is possible to obtain a light-signal transmission range that extends in a predetermined range.

In the device according to the third embodiment the thicknesses of the refractive layers 4-2, 5-2 and 6-2 may be formed so as to be least on the heads of the light-emitting surfaces 4A, 5A and 6A and to gradually increase from the heads to the peripherals of the light-emitting surfaces 4A, 5A and 6A, instead of the refractive layers 4-2, 5-2 and 6-2 which are formed so as to have constant thicknesses.

Figure 4A:
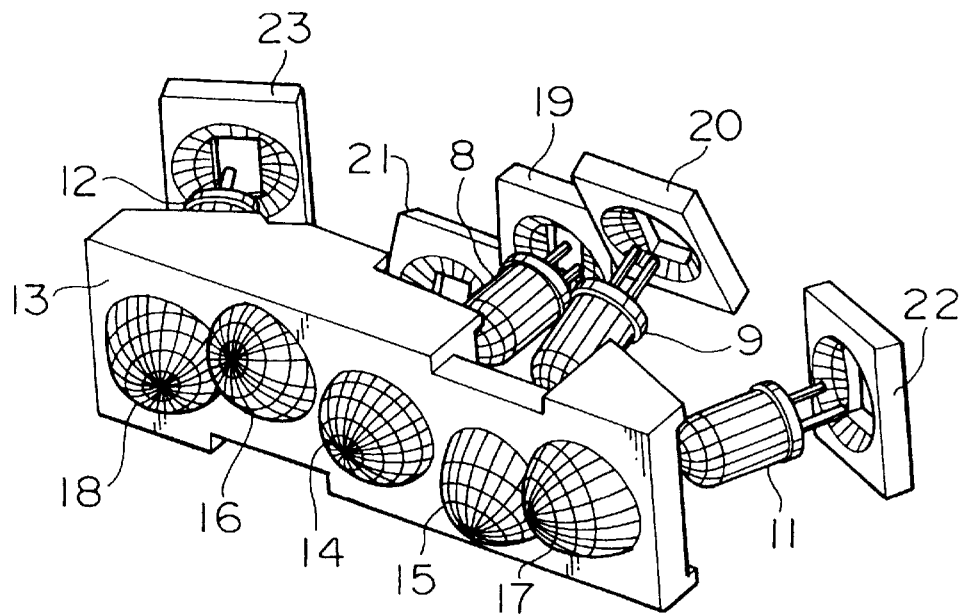
FIGS. 4A and 4B are partially exploded perspective views illustrating a light-emitting diode device according to a fourth embodiment of the present invention.
Figure 4B:
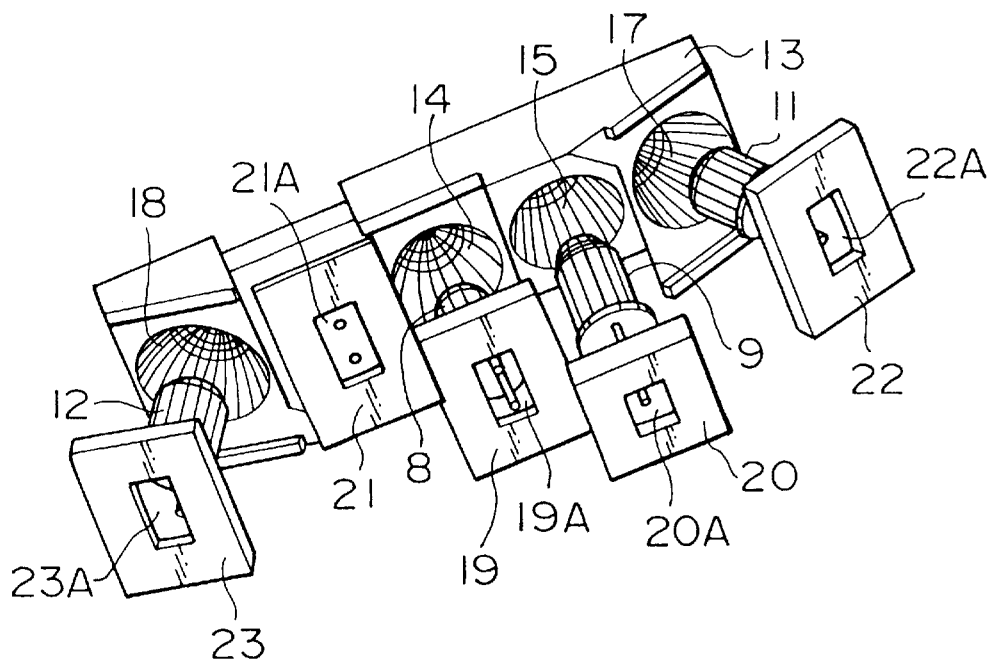

FIGS. 4A and 4B illustrate the structure of a light-emitting diode device according to a fourth embodiment of the present invention. FIG. 4A is a partially exploded perspective view illustrating the front of the light-emitting diode device, while FIG. 4B is a partially exploded perspective view illustrating the back of the device, which device has five light-emitting diodes.

As shown in FIGS. 4A and 4B, light-emitting diodes for emitting infrared light, 8, 9, 10, 11 and 12, each have a light-emitting surface (not denoted by a reference numeral), a rim (not denoted by a reference numeral), and a lead (not denoted by a reference numeral). A common cap support 13 which is formed in the form of a block have cavities (not denoted by reference numerals) into which the respective diodes 8, 9, 10, 11 and 12 are inserted, five lens caps 14, 15, 16, 17 and 18 reaching these cavities, the heads of which project spherically, and fixer-portions (not denoted by reference numerals) in which five rectangular covers 19, 20, 21, 22 and 23, which are mentioned below, are fixed. These rectangular covers 19, 20, 21, 22 and 23 receive the rims of the corresponding light-emitting diodes 8, 9, 10, 11 and 12, and have openings 19A, 20A, 21A, 22A and 23A through which the corresponding leads pass. The projecting portions of the lens caps 14, 15, 16, 17 and 18 are respectively provided with light-diffusion filters obtained by forming fine irregularities at random on the surfaces of the portions.

In order to assemble the light-emitting diode devices, at first, by inserting the rims of the light-emitting diodes 8, 9, 10, 11 and 12 into the openings 19A, 20A, 21A, 22A and 23A of the corresponding covers 19, 20, 21, 22 and 23, the respective light-emitting diodes 8, 9, 10, 11 and 12 are mounted on the covers 19, 20, 21, 22 and 23. Subsequently, with the light-emitting surfaces of the light-emitting diodes 8, 9, 10, 11 and 12 mounted on the covers 19, 20, 21, 22 and 23, the light-emitting diodes 8, 9, 10, 11 and 12 are fixed in the cavities of the common cap support and the lens caps 14, 15, 16, 17 and 18. The covers 19, 20, 21, 22 and 23 on which the light-emitting diodes 8, 9, 10, 11 and 12 are mounted are fixed in the corresponding fixer-portions of the common cap support 13, so that the light-emitting diodes 8, 9, 10, 11 and 12 are disposed in the common cap support 13. In this arrangement refractive layers (not denoted by a reference numeral), formed by, for example, air layers, are formed respectively between the light-emitting surfaces 8A, 9A, 10A, 11A and 12A of the light-emitting diodes 8, 9, 10, 11 and 12, and the interiors of the lens caps 14, 15, 16, 17 and 18. Similar to the refractive layer 3 shown in FIG. 3, the thicknesses of these refractive layers are formed so as to be constant over the whole light-emitting surfaces 8A, 9A, 10A, 11A and 12A of the light-emitting diodes 8, 9, 10, 11 and 12.

The operation and the obtained advantages of the light-emitting diode device according to the fourth embodiment are almost the same as those of the light-emitting diode device according to the third embodiment. Accordingly, the description of both the operation and the obtained advantages of the device according to the fourth embodiment will be omitted.

In the device according to the fourth embodiment the light-diffusion filters are disposed by forming fine irregularities at random on the projecting portions of the respective lens caps 14, 15, 16, 17 and 18. Therefore, it is possible to smooth the shape of the intensity distribution (field) of light which is emitted from the light sources of the light-emitting diodes 8, 9, 10, 11 and 12, and which is projected through the lens caps 14, 15, 16, 17 and 18. Further, when this light-emitting diode device is used in an optically positional detection apparatus or the like, an additional advantage in which a movement of a cursor can be smoothed is obtained.

In the fourth embodiment the device in which the light-diffusion filters formed on the projecting portions of the lens caps 14, 15, 16, 17 and 18 has been described. However, the light-diffusion filters are not limited to be formed on the projecting portions of the lens caps 14, 15, 16, 17 and 18. On the fronts of the lens caps light-diffusion filters may be separately formed.

In the fourth embodiment the device in which the thicknesses of the refractive layers are approximately constant over the whole light-emitting surfaces 8A, 9A, 10A, 11A and 12A. However, the thicknesses of the refractive layers may be least on the heads of the light-emitting surfaces 8A, 9A, 10A, 11A and 12A, which agree with the optical axis, and may gradually increase from the heads to the peripheral portions of the light-emitting surfaces 8A, 9A, 10A, 11A and 12A.

In the first to third embodiments the devices in which the light-emitting diodes 1, 5 to 7 and 8 to 12 emit infrared light have been described. However, the light-emitting diodes 1, 5 to 7 and 8 to 12 according to the present invention are not limited to infrared light emitters, and may emit visible rays.

In the first to third embodiments the devices in which the refractive layer 3 is formed by the air layer. However, a medium that forms the refractive layer 3 used in the present invention is not limited to the air layer, and may be another medium if it has a refractive index different from the refractive index of the synthetic resin, for example, water or the like.

What is claimed is:

1. A light-emitting diode device comprising:

light-emitting diode having a light source covered by a light-emitting surface;

lens cap made of synthetic resin, for covering said light-emitting surface of said light-emitting diode;

a light-diffusion filter disposed on the front of said lens cap; and refractive layer formed between said light-emitting surface and said lens cap, said refractive layer having a composition with a refractive index different from the refractive index of said synthetic resin.

2. A light emitting diode device according to claim 1, wherein said refractive layer is formed by an air layer, and the thickness of said air layer is least on the head of said light-emitting surface and is larger as said layer is closer to the peripheral portion of said light-emitting surface.

3. A light-emitting diode device according to claim 1, wherein a light-diffusion filter comprises a surface of said lens cap on which surface fine irregularities are formed at random.

4. A light-emitting diode device according to claim 1, further including:

a plurality of light-emitting diodes arranged so that the angles of the respective optical axes thereof are different;

a plurality of lens caps formed on a common cap support with respect to said plurality of light-emitting diodes; and a plurality of refractive layers formed between said lens caps disposed on said common cap support and the light-emitting surfaces of said plurality of light-emitting diodes corresponding to said respective lens caps.

* * * * *